United States Patent

So et al.

Patent Number: 5,747,853
Date of Patent: May 5, 1998

[54] SEMICONDUCTOR STRUCTURE WITH CONTROLLED BREAKDOWN PROTECTION

[75] Inventors: Koon Chong So, San Jose; Fwu-Iuan Hshieh, Saratoga; Danny C. Nim, San Jose; True-Lon Line, Cupertino; Yan Man Ysui, Union City, all of Calif.

[73] Assignee: MegaMos Corporation, San Jose, Calif.

[21] Appl. No.: 693,950

[22] Filed: Aug. 7, 1996

[51] Int. Cl.$^6$ .................................................. H01L 23/62
[52] U.S. Cl. .......................... 257/355; 257/409; 257/488; 257/494; 257/495
[58] Field of Search ............................... 257/355, 409, 257/341, 401, 494, 495, 483, 488

[56] References Cited

U.S. PATENT DOCUMENTS

| | | | |
|---|---|---|---|
| 4,532,534 | 7/1985 | Ford et al. | 357/23.4 |
| 4,618,875 | 10/1986 | Flohrs | 357/46 |
| 4,631,564 | 12/1986 | Neilson et al. | 357/23.4 |
| 5,184,204 | 2/1993 | Mihara et al. | 357/629 |
| 5,324,971 | 6/1994 | Notley | 257/133 |
| 5,376,815 | 12/1994 | Yokota et al. | 257/341 |

OTHER PUBLICATIONS

Korec et al., "Comparison of D/MOSIGBT-Compatible High-Voltage Termination Structure and Passivation Techniques", *IEEE Transactions on Electronic Devices*, vol. 40, No. 10, Oct. 1993, pp. 1845-1853.

Boisson et al., "Computer Study of a High-Voltage p-π-n⁻-n⁺ Diode and Comparison with a Field-Limiting Ring Structure", *IEEE Transaction on Electron Devices*, vol. 33, No. 1, Jan.1986, pp. 80-84.

Shenai, "Optimally Scaled Low-Voltage Vertical Power MOSFET's for High-Frequency Power Conversion", *IEEE Transaction on Electronic Devices*, vol. 40, No. 37, No. 4, Apr. 1990, pp. 1141-1153.

*Primary Examiner*—Sara W. Crane
*Attorney, Agent, or Firm*—Kam T. Tam

[57] ABSTRACT

A power semiconductor device having internal circuits characterized by an electrical breakdown during one mode of operation is implemented with a protective circuit. The electrical breakdown is controllably induced to occur at the protective circuit thereby diverting any breakdown in the active circuits. In the preferred embodiment, the power device is a MOSFET (Metal Oxide Semiconductor Field Effect Transistor) in which the protective circuit is deposited as an annular diffusion ring having a shallow portion and a deep portion. The deep portion is higher in doping concentration than the shallow portion and includes a radius of curvature larger than the shallow portion. The radius of curvature of the deep portion can be adjusted to induce breakdown at or above the rated value of the MOSFET. The predetermined doping concentration of the deep portion can abort the breakdown prematurely to occur at the deep region instead of at the active circuits. Electrical contacts are tied to the annular diffusion ring to gravitate any charge carriers generated during the electrical breakdown so as to prevent the charge carriers from reaching the active circuits, thereby further ensuing no breakdown at the internal circuits.

18 Claims, 5 Drawing Sheets

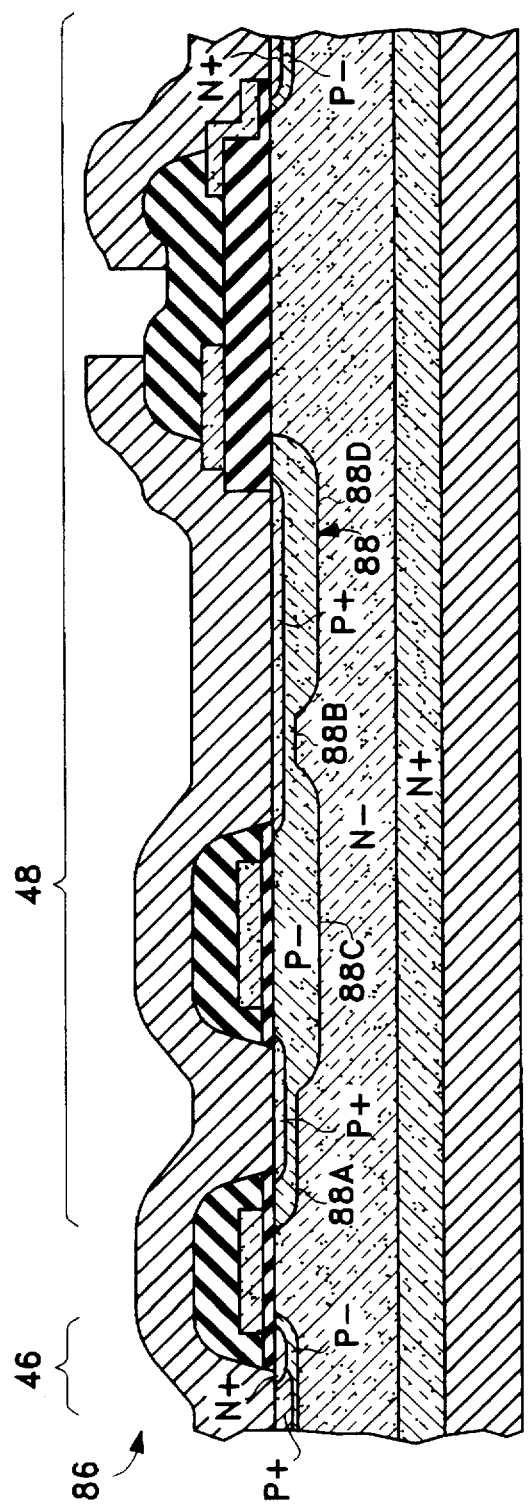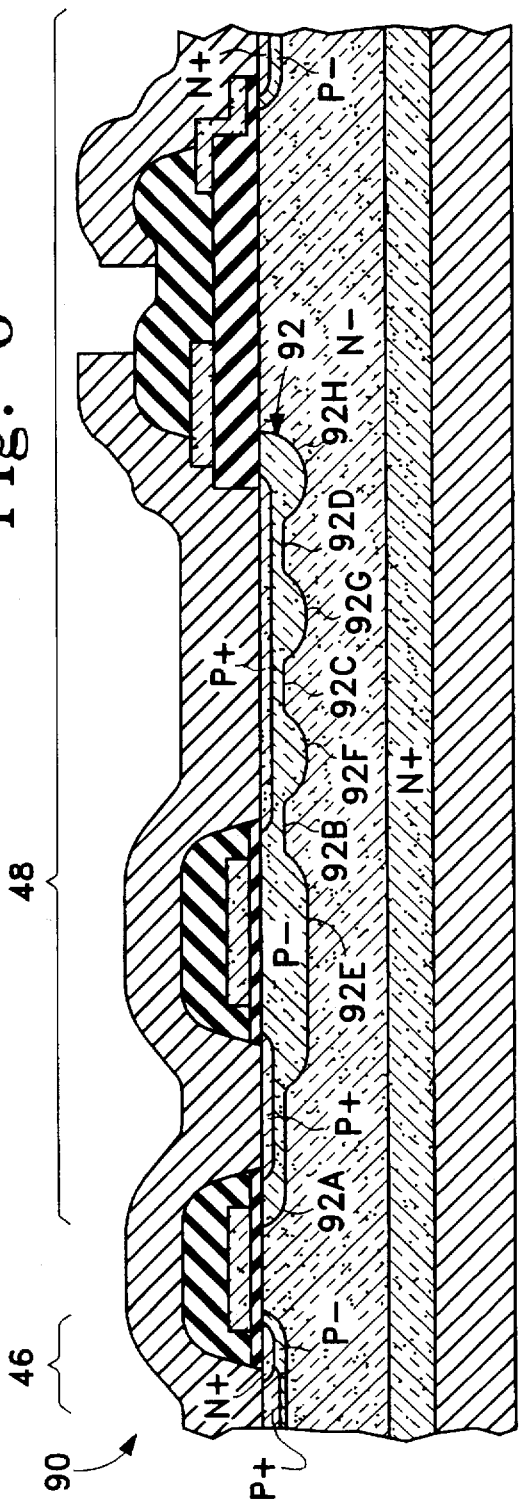

SEMICONDUCTOR STRUCTURE WITH CONTROLLED BREAKDOWN PROTECTION

BACKGROUND OF THE INVENTION

1. Field of the Invention

The present invention relates generally to microelectronic circuits, and more particularly, to power MOSFETs (Metal Oxide Semiconductor Field Effect Transistor) having controlled breakdown protection and capable of low power consumption.

2. Description of the Related Art

Power semiconductor devices have long been used as replacement for mechanical relays in various applications. Advent in semiconductor technology enables these power devices to operate with high reliability and performance. Various instruments, now built at a miniaturized scale with lower power consumption, all require different breeds of power devices. Examples of such instruments are fast switching power supplies, high-frequency ballasts, laptop computers and robotics controls. However, power devices built for low power consumption also necessitate the devices to be built with lower breakdown voltages. The underlying reasons for this compromise will be explained later in this specification. Heretofore, processing and operating of such low breakdown power devices have been fraught with various technical complications. Chief among all is the uncontrollable breakdown problems causing irreparable damages to the devices.

FIG. 1 shows a conventional power MOSFET (Metal Oxide Silicon Field Effect Transistor) generally signified by the reference numeral 2, which comprises a substrate 4. Defined in the substrate 4 are various diffusion or implant regions. For example, there are source regions 6 which are heavily doped with N-type material. Similarly, there are channel diffusion regions 8 which are lightly doped with P-type material. The drain 10 comprises an epitaxial layer 12 disposed in contact with a heavily doped contact layer 14 which is formed of N-type material. There are polysilicon gates 16 disposed above gate oxide layers 18 which in turn are deposited atop the channels 20. The gates 16 are electrically connected together via bridging traces not shown in FIG. 1. Similarly, the sources 6 are also electrically tied together.

During normal operations, the sources 6 are connected to the ground potential. At the same time, a positive potential is applied across the drain 10 and the sources 6. A drain-to-source voltage $V_{DS}$ is established. In a similar fashion, a gate-to-source voltage $V_{GS}$ is also applied across the gate 16 and the source 6 terminals. The $V_{GS}$ voltage capacitively induces N-type channels 20 underneath the gate oxides 18. The channel 20 allows the $V_{DS}$ voltage to drive a drain-to-source current $I_{DS}$ from the drain 10 to the sources 6.

Reference is now directed to FIGS. 2. which shows graphically the relationship between the drain-to-source voltage $V_{DS}$ and the drain-to-source current $I_{DS}$ for the MOSFET 2. During normal operations, the MOSFET 2 operates below the breakdown voltage $V_{BD}$. However, due to inadvertence or noise spikes, the drain-to-source voltage $V_{DS}$ may exceed beyond the breakdown limit $V_{BD}$. It should be emphasized that the noise spikes occur very frequently. This is especially true when the MOSFET 2 is steering an inductive component. For example, suppose the MOSFET 2 is driving the solenoid of a servo motor. As is well known in the art, voltage generated by an inductive coil is proportional to the rate of change of current in accordance with the relationship:

$$v = L \frac{di}{dt}$$

where v is the voltage generated in Volts; L is the inductance of the coil in Henry; and di/dt is the rate of change of current passing through the coil in Amperes/sec. The motor solenoid is an inductor of high inductance. A sudden injection or cessation of current to the solenoid would generate a voltage spike sufficient to break down the MOSFET 2.

To further understand the breakdown mechanisms, reference is now directed back to FIG. 1. When the MOSFET 2 is operated under $V_{BD}$, the channel diffusion regions 8 and the epitaxial region 12 are essentially under reverse bias. Accordingly, depletion layers 22 are formed at the junction interface. It should be noted that depletion layers 22 are formed at all of the junctions between the regions 8 and 12. For the sake of clarity in illustration, only one depletion layer 22 is shown in FIG. 1. When the drain-to-source voltage $V_{DS}$ exceeds the breakdown voltage limits $V_{BD}$, such as caused by the noise spike as mentioned above, breakdown ensures. The breakdown is of the avalanche type in which a multiplicity of holes and electrons are generated and multiplied in the depletion region 22 in a chain-reaction manner. Avalanche breakdown commonly triggers at the junction contour with the smallest radius of curvature, wherein the electric field is at the highest concentration. For example, as shown in FIG. 1, electric field lines, denoted by the reference numeral 23, is the highest in concentration per unit area at the diffusion region corner 25.

Normally, if the breakdown lasts for a short duration, no permanent damages will be sustained. However, embedded in the MOSFET 2 are a number of parasitic NPN bipolar transistors 24 which can gravitate and exacerbate the breakdown and can cause detrimental results to the MOSFET 2.

As shown in FIG. 1, the source 6 is of N-type which corresponds to the emitter E of the NPN transistor 24. Similarly, the channel diffusion region 8 is of P-type which acts as the base B of the NPN transistor 24. The N-type drain 10 is the common collector of all the transistors 24. The channel diffusion regions 8 are lightly doped regions and assume high resistivity. Small amount of hole current passing through the regions 8 will suffice to generate a voltage of sufficient magnitude to turn on the base-to-emitter voltage $V_{BE}$ of the NPN transistor 24. However, as mentioned above, there is a multiplicity of holes generated at the depletion region 22 during avalanche breakdown. The generated holes, being positively charged, are attracted to the regions with the lowest potential. In this case, the sources 6 and the channel diffusion regions 8 are tied to the ground potential. As a consequence, the generated holes rapidly migrate to these regions and turn on the base-to-emitter voltage $V_{BE}$ of the NPN transistor 24. When the transistor 24 is turned on, only a small base-to-emitter voltage $V_{BE}$ is sufficient to maintain a collector-to-emitter $I_{CE}$ current of high magnitude. The Joule heat generated from the high current would surely damage the MOSFET 2.

The destructive actions of the transistors 24 can be further explained in FIG. 2. As shown in FIG. 2, once the drain-to-source voltage $V_{DS}$ reaches the breakdown value $V_{BD}$, the transistors 24 are turned on even after the withdrawal of the noise spike. When the drain-to-source voltage $V_{DS}$ returns to a normal value $V_{normal}$, the MOSFET has already passed a point of no return in which only a small $V_{DS}$ would sustain a continuous and damaging current.

Attempts have been made in the past to tackle the aforementioned problems. A common approach is to reduce the sharp curvature effect of the diffusion regions by implanting successive floating guard rings around the MOSFET cells as a protective mechanism. Shown in FIG. 3 is such a scheme in which P-type diffusion rings 28A–28D are deposited at the periphery of a MOSFET 30. The diffusion rings 28A–28D are electrically floating and are tied to no fixed potential. As arranged, the potential of the ring 28A is somewhat slightly higher than the potential of the channel diffusion region 8. Likewise, the last ring 28D is somewhat higher in potential than its adjacent ring 28C. Phrased differently, the potential difference between the ring 28A and the epitaxial layer 12 is somewhat lower than the corresponding potential difference of between the channel diffusion region 8 and the epitaxial layer 12. By the same line of reasoning, the potential differences diminish in value as the equi-potential frontiers 32 progress toward away from the region 8. Breakdown at the ring 28D is far less likely because the reverse bias potential at the ring 28D is reduced. That is, the equipotential lines 32 are essentially stretched by the floating rings 28A–28D so as to eliminate any shape curvatures, thereby avoiding any accumulation of electric field on confined spaces.

The guard ring approach appear to be effective for high breakdown devices but the advantages are far less eminent for low breakdown counterparts. To begin with, as mentioned before, a power MOSFET device capable of low power consumption must be compromised with lower breakdown voltage. To achieve this end, the epitaxial layer 12 is more heavily doped in a low breakdown device than in a high breakdown device. It naturally follows that the heavier the epitaxial layer 12 is doped, the less is the layer 12 in resistivity. The less resistive epitaxial layer 12 curtails the on-state power of the MOSFET 30 in accordance with the equation:

$$P = I^2 R$$

where P is the power of the consumes by the MOSFET 30 in Watts; I is the on-state current passing through the MOSFET 30 in Amperes; and R is the total resistance between sources 6 to the drains 8 of the MOSFET 30 in Ohms. However, when the epitaxial layer 12 is doped with a heavier dosage, inter alia, not only is the breakdown voltage lower but the depletion width is also substantially narrower. As a consequence, the ring-to-ring separations d become more significant. If the value of d is too large, the equipotential lines 32 may never reach the farther rings and render the entire ring structure ineffective in preventing breakdown. If the value of d is to small, all rings 28A–28D may effectively merge together as one large ring sharing the same potential. As such, the merged ring with its shared potential may still be vulnerable to breakdown at areas with sharp curvatures. In reality, the separation d is hard to control during fabrication. Any deviations in manufacturing tolerance, such as side diffusion, variation of both lines and spaces to define the ring separations, and epitaxial resistivity, all can alter the ultimate value of the separation distance d. Moreover, the guard ring arrangement only attempts to stretch the breakdown limits $V_{BD}$. Breakdown can still occur internally at the active cells and can cause irreparable damages as mentioned above. There is also no mechanism at the guard rings 28A–28D to clean up the generated holes in the event of breakdown, which holes can be swept toward the parasitic NPN transistor 24 and cause permanent destruction of the MOSFET 30.

Examples of use of the guard ring approach can be found in Boisson et al., "Computer Study of a High-Voltage p-π-n⁻- $n^+$ Diode and Comparison with a Field-Limiting Ring Structure", *IEEE Transactions on Electron Devices*, Vol. ED-33, No. 1, January 1986, pages 80–84.

Another approach is to use a field plate to lengthen the equipotential lines 32 as shown in FIG. 4. There is a field oxide layer 36 sandwiched between a field plate 34 and the epitaxial layer 12 of a MOSFET 38. Again, the intent is to rely on the field plate 34 to stretch the equipotential frontier 32 so as to eliminate any regions with sharp curvatures. The drawback with this approach is the same as explained above for the separation d in the MOSFET 30. The effectiveness of the field plate 34 becomes increasingly sensitive to the thicknesses of the field oxide t1 and t2 as the doping concentration of the epitaxial layer is increased. Consequently, the thickness values t1 and t2 need to be critically controlled during fabrication. As with the MOSFET 30, there is no guarantee that there would be no internal breakdown at the active cells, and there is further no mechanism to clean up the generated holes from sweeping into the internal active circuits in the event of breakdown.

Examples of use of the field plate approach can be found in Korec et al., "Comparison of DMOS/IGBT-Compatible High-Voltage Termination Structures and Passivation Techniques", *IEEE Transactions on Electron Devices*, Vol. 40, No. 10, October 1993, pages 1845–1853.

There are other schemes that combine both the guard ring and field plate in a semiconductor structure as protection. Examples of such scheme can be found in Shenai, "Optimally Scaled Low-Voltage Vertical Power MOSFET's for High-Frequency Power Conversion", *IEEE Transactions on Electron Devices*, Vol. 37, No. 4, April 1990, pages 1141–1153.

To address the problem of permanent damages caused by the parasitic transistors 24 as shown in FIG. 1, some prior art devices incorporate heavily doped P-type buried layers underneath the sources 6, in an effort to reduce the base resistance of the transistors 24. However, the drawback with the this arrangement is that more diffusion layers and processing steps are involved. Furthermore, there is no sure safeguard that the parasitic NPN transistors 24 are completely shut off. In the event of breakdown, the avalanche of holes can still flood the buried layers, and consequently turn on the parasitic transistors 24.

Prior art schemes described above are mostly suitable for devices with high breakdown voltages and with deep body diffusion junctions. For devices with low rated breakdown voltages and with junction depths less than 1 µm, different approaches need to be adopted to address the unavoidable breakdown issues.

Instruments are now more miniaturized, more complexly built, and provide more functions with less power consumption. These instruments require robust power devices with low on-state resistance and high reliability. There is a long-felt need for power semiconductor devices to meet these demands.

SUMMARY OF THE INVENTION

It is the object of the invention to provide a power semiconductor device capable of operating at low power level, yet with controllable electrical breakdown at a predetermined range and location, thereby providing reliable device protection. The objective of providing such protection to the semiconductor device at low manufacturing cost is also sought.

The present invention meets the foregoing objectives by providing a novel arrangement in which a protective circuit is implemented. The electrical breakdown is controllably induced to occur at the protective circuit in the event of breakdown occurrence, thereby diverting any breakdown at other parts of the device. In the preferred embodiment, the power device is a MOSFET in which the protective circuit is deposited as an annular diffusion region having a shallow portion and a deep portion. The deep portion is higher in doping concentration than the shallow portion and includes a radius of curvature larger than the shallow portion. The radius of curvature of the deep portion can be adjusted to induce breakdown at or above the rated value of the MOSFET. The predetermined doping concentration of the deep portion can prematurely abort the breakdown such that the breakdown can never reach the active circuits.

Electrical contacts are also connected to the annular regions to gravitate and attract any charge carriers generated during the breakdown, thereby providing additional safeguard that the charge carriers can never reach the internal active circuits and cause irreparable damages.

These and other features and advantages of the invention will be apparent to those skilled in the art from the following detailed description, taken together with the accompanying drawings, in which like reference numerals refer to like parts.

DESCRIPTION OF THE DRAWINGS

FIG. 6 is a cross-sectional view of a second embodiment of the power device of the invention;

FIG. 7 is a cross-sectional view of a third embodiment of the power device of the invention.

DETAILED DESCRIPTION OF THE INVENTION

Figures 5, 5A:
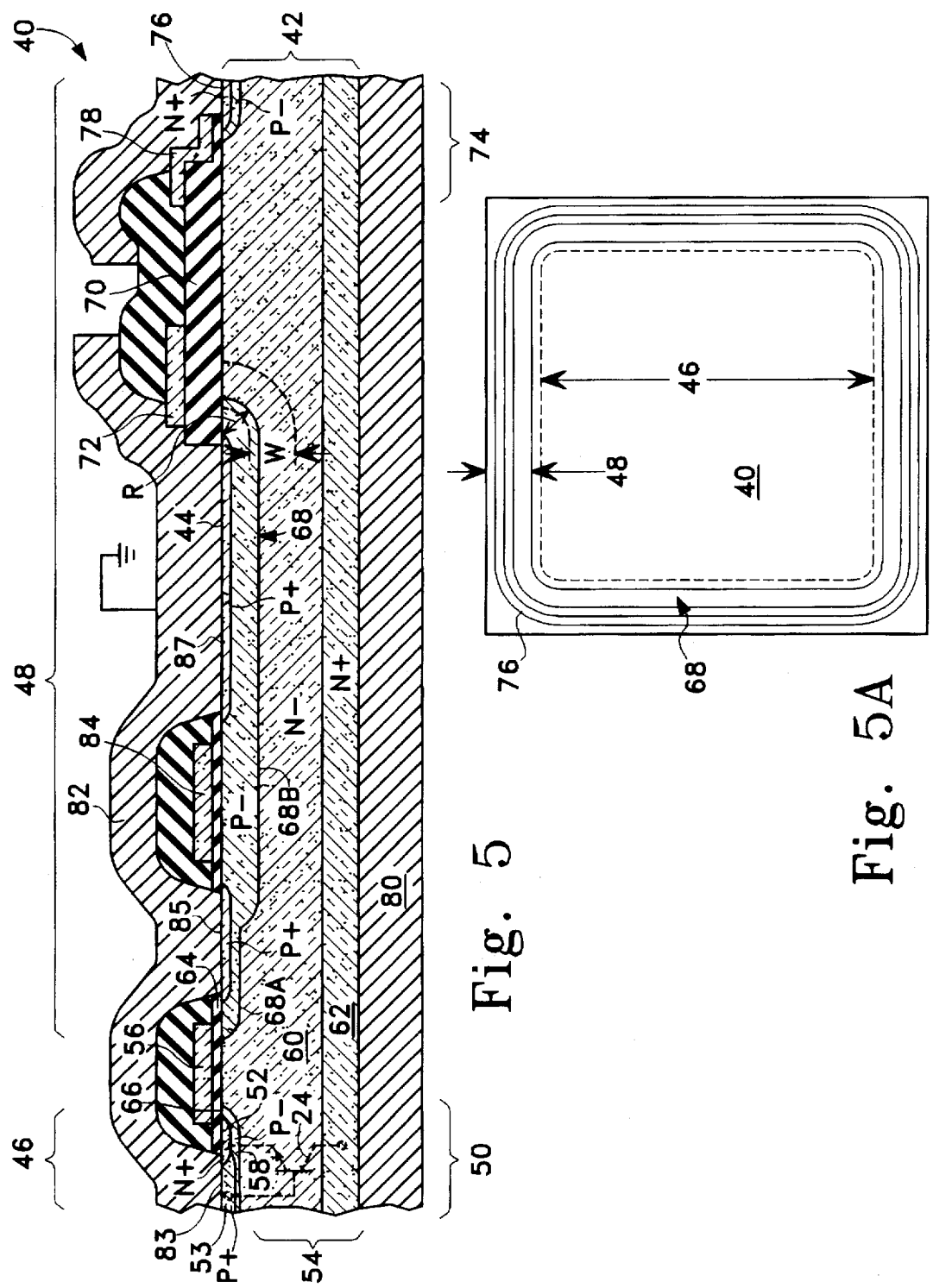
FIG. 5 is a cross-sectional view of a power device in accordance with the invention.
FIG. 5A is a top elevational view of the power device as shown in FIG. 5.

Reference is now made to FIG. 5 which shows the first embodiment of the invention. The semiconductor structure of the invention is generally designated by the reference numeral 40 which comprises a substrate 42 having a major surface 44. Disposed in the substrate 42 and adjacent to the major surface 44 are various diffusion or implant regions. The semiconductor structure 40 can be approximately partitioned into an active circuit zone 46 and a termination circuit zone 48.

In the active circuit zone 46 are MOSFET cells. One of the cells is shown in FIG. 5 as cell 50 having a source 52, a drain 54 and a gate 56. In this embodiment, the source 52 is doped with N-type material. Adjacent to the source 52 is a compensation region 53 formed of P-type material deposited in the substrate 42 to prevent latch-up of the MOFSET 40. There is a channel diffusion region 58 which is lightly doped with P-type material. The drain 54 includes an epitaxial layer 60 laid in contact with a contact layer 62 which is formed of heavily doped N-type material. The gate 56 is made of polysilicon disposed above a gate oxide layer 64 which in turn are deposited atop the channel 66.

The termination circuit zone 48 includes an annular region 68 disposed in the substrate 42 and adjacent to the major surface 44. The annular region 68 in this embodiment is rectangular in shape having round off corners and is disposed surrounding the active circuit zone 46 as shown in the top elevation view of FIG. 5A. The annular region 68 has a cross-sectional profile which defines a shallow portion 68A and deep portion 68B. The deep portion 68B is doped to a concentration higher than other diffusion regions, such as the shallow portion 68A and the channel diffusion regions 58. In this embodiment, the doping concentration for the deep region 68B falls within the range of between $2 \times 10^{14}$ cm$^{-2}$ to $2 \times 10^{15}$ cm$^{-2}$. The corresponding doping concentration for the shallow region 68A and the channel diffusion region 58 is lower than $1.5 \times 10^{14}$ cm$^{-2}$. The edge of the deep portion 68B also has a radius of curvature R. The doping concentration of the deep portion 68B and the curvature R cooperatively play an important role in the invention and are herein described.

As with other power devices, during normal operations for the MOSFET 40, the junction between the epitaxial layer 60 and the channel diffusion region 58 are reversely biased. A depletion layer is formed characterized by the depletion width W which is small in comparison with the high voltage device counterparts. The MOSFET 40 in this embodiment has a breakdown voltage rating of 65 Volts. As described before, electrical breakdown tends to trigger around areas with small radii of curvature. In the MOSFET 40, the most vulnerable spots to nucleate breakdown are at the outer edges of the shallow and deep portions 68A and 68B. However, the deep portion 68B is higher in doping concentration than other regions, such as the shallow portion 68A, and the channel diffusion regions 58. It should be noted that avalanche breakdown depends not only on the topological shape of the semiconductor junction but also the doping concentration of the adjoining junctions. Here, the radius of curvature R can be tuned to have breakdown voltage comfortably above the minimum guaranteed breakdown voltage $V_{BD}$, and at the same time, the doping concentration of the deep portion 68B can be adjusted to a level sufficient to trigger breakdown earlier than breakdown in other regions, such as the shallow portions 68A or the internal cells 50.

Figure 1:
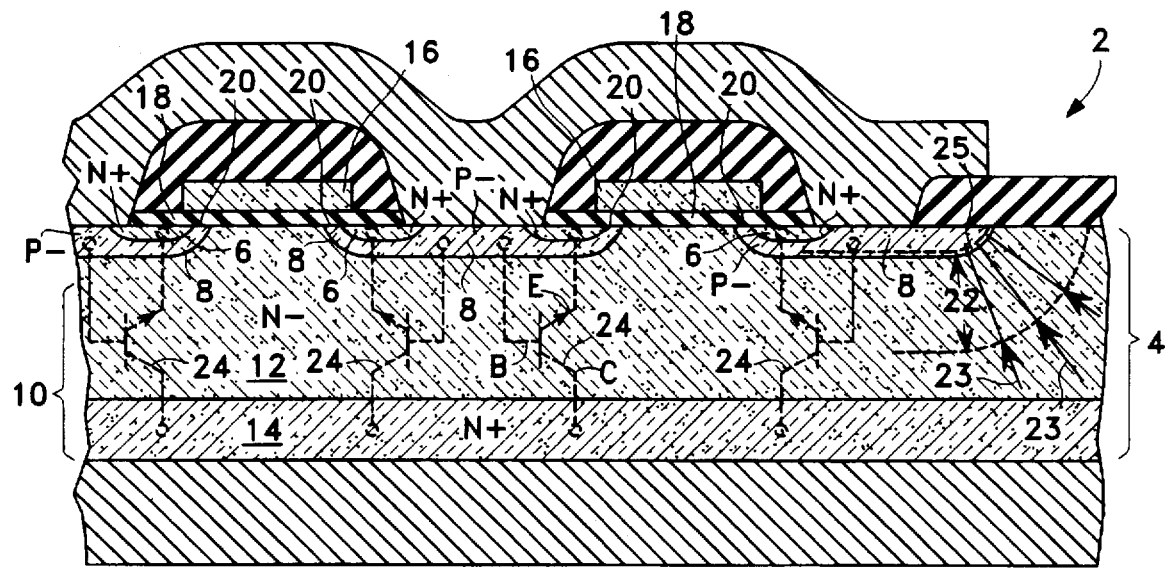
FIG. 1 is a cross-sectional view of a conventional MOSFET power device showing the various layers and the parasitic components.
Figure 2:
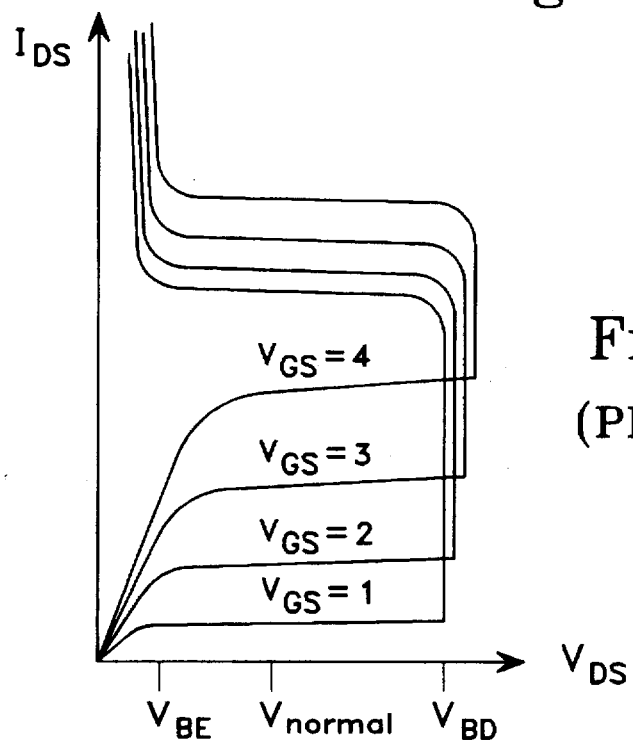
FIG. 2 is a graphical representation of breakdown characteristic of the power device shown in FIG. 1.
Figure 3:
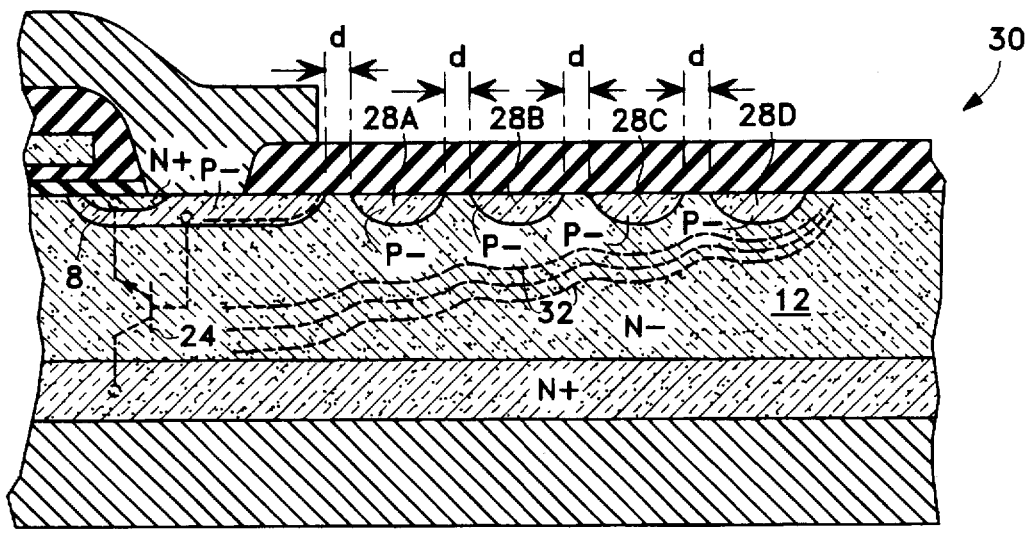
FIG. 3 is a cross-sectional view of another conventional MOSFET power device having floating rings as breakdown protection.
Figure 4:
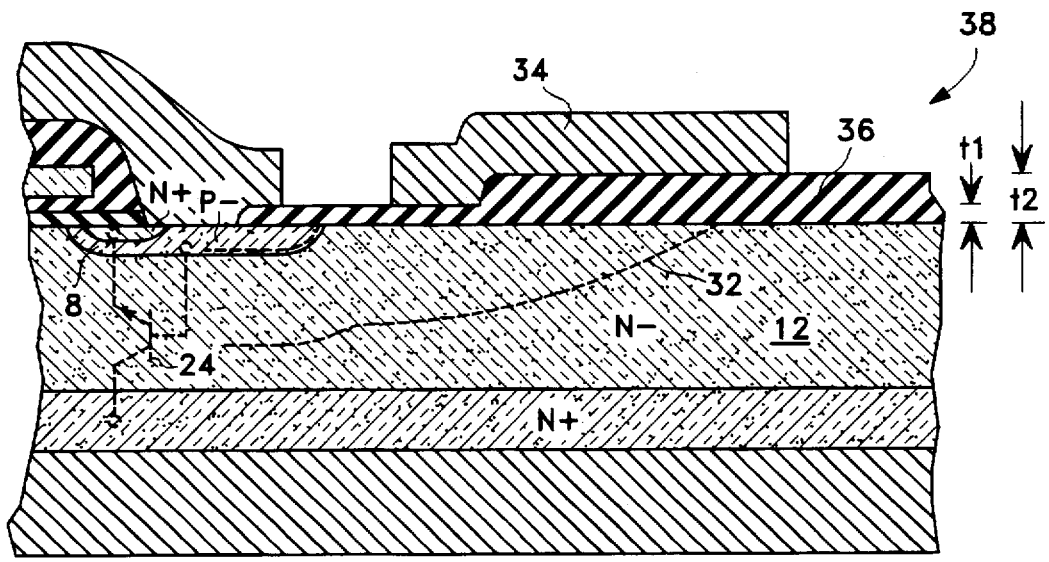
FIG. 4 is a cross-sectional view of yet another conventional MOSFET power device having a floating plate as breakdown protection.

Unlike other parameters, such as the junction depth, separation d (FIG. 3), or field oxide thickness (FIG. 4) which are difficult to control in processing, doping concentration can be accurately monitored and administered. The curvature having the radius R of the deep portion 68 increases or decreases in tandem with the corresponding curvatures in the internal cells 50. In conjunction with the safety margin allowed to be designed above the rated minimum $V_{BD}$, avalanche breakdown, should it happen, can be controllably confined in the annular region 68 with a high degree of certainty.

In addition to above, instead of electrically floating, the annular region 68 are tied to the ground potential. Any charge carriers, such as holes generated during breakdown in this embodiment, can be swept and cleaned up by the deep portion 68B. Any remnant holes would be swiftly dealt with by the shallow region 68A.

The shallow region 68A is found to be very effective to gravitate and attract the remnant holes. The rationale behind this unexpected result is not entirely clear. It is speculated that the deep-to-shallow curvature transition creates directional electric field lines which effectively attract the remnant holes in all directions toward the conductive contact 82. As a consequence, the holes can never reach the parasitic NPN transistor 24 and subsequently causing disastrous destruction to the MOSFET 40.

Atop the deep portion edge 68 and separated by a field oxide 70 is a polysilicon shield 72 which is implemented for the shielding of stray charges into the junctions formed between the deep region 68B and the epitaxial layer 60.

There is also a channel stopper circuit 74 having a channel shielding ring 78 formed of polysilicon disposed dielectrically separated from a channel stopping ring 76 formed in the substrate 42. The function of the channel shielding ring 78 is to capacitively restrain the depletion layer from further progressing toward the edge of the MOSFET die which may be accumulated with unknown charges.

There are conductive contacts connected to the MOSFET 40 for effective bonding of the MOSFET 40 with a die carrier. For example, a drain lead 80 is disposed in contact with the drain contact layer 62. A source lead 82 is disposed in the contacts 83, 85 and 87 for contacting the source 52, the shallow portion 68A and the deep portion 68B, respectively. There is a conductive trace 84 disposed above and dielectrically separated from the annular region 68. The conductive trace 84, made of polysilicon in this embodiment, serves the duty of electrically connecting the polysilicon gates 56 of the active cells 50. Instead of consuming die space in the active circuit zone 46, the trace 84 is positioned in termination zone 48. The consequential benefit is that all die space of the MOSFET is effectively utilized.

Shown in FIG. 6 is a second embodiment of the invention. The MOSFET of this embodiment is signified by the reference numeral 86. The difference between the MOSFET 86 of this embodiment and the previous embodiment is that there is an annular region 88 having another shallow region 88B disposed between two deep portions 88C and 88D. The installation of the shallow portion 88B is to allow the holes to be cleaned up more effectively during breakdown, thereby preventing the holes to trespass into the active circuit zone 46 and cause damages.

Shown in FIG. 7 is third embodiment of the invention in which the MOSFET is denoted by the reference numeral 90. In this embodiment, the annular region 92 is implemented with a plurality of shallow regions 92A–92D disposed between a plurality of deep regions 92E–92H. As described before, the shallow regions, such as the regions 92A–92D, are very effective to attract and gravitate the remnant holes. The shallow regions 92A–92D act as successive hole-trapping sites which ensure that no holes can pass beyond the annular region 68 into the active circuit zone 46.

The rest of the operational details of the MOSFET 86 and 90 are substantially the same as the MOSFET 40 described in the previous embodiment. For the sake of conciseness, they are not further repeated in here. Moreover, conventional thin-film semiconductor processing techniques can be used to fabricate the MOSFETs 40, 48 and 60 and are also not further elaborated.

It should be noted that for all the embodiments as described above, there is only one extra step of driving the deep portion for the annular region involved, and a small amount of die space for the deposition of the annular region. No special tooling or setup are required. The annular regions 68, 88 and 92 in MOSFETs 40, 86 and 90, respectively, implemented as described above, can abort and dissipate breakdown prematurely at the regions 68, 88, and 92 should it occur, such that no full-scale breakdown can reach the active circuit zone 46. As an additional level of safeguard, the multiplicity of charge carriers generated during breakdown are effectively absorbed by the annular regions 68, 88 and 92 via the electrical contacts 85 and 87 tied to the proper potential. Accordingly, reliable device protection is ensured.

Figure 8:
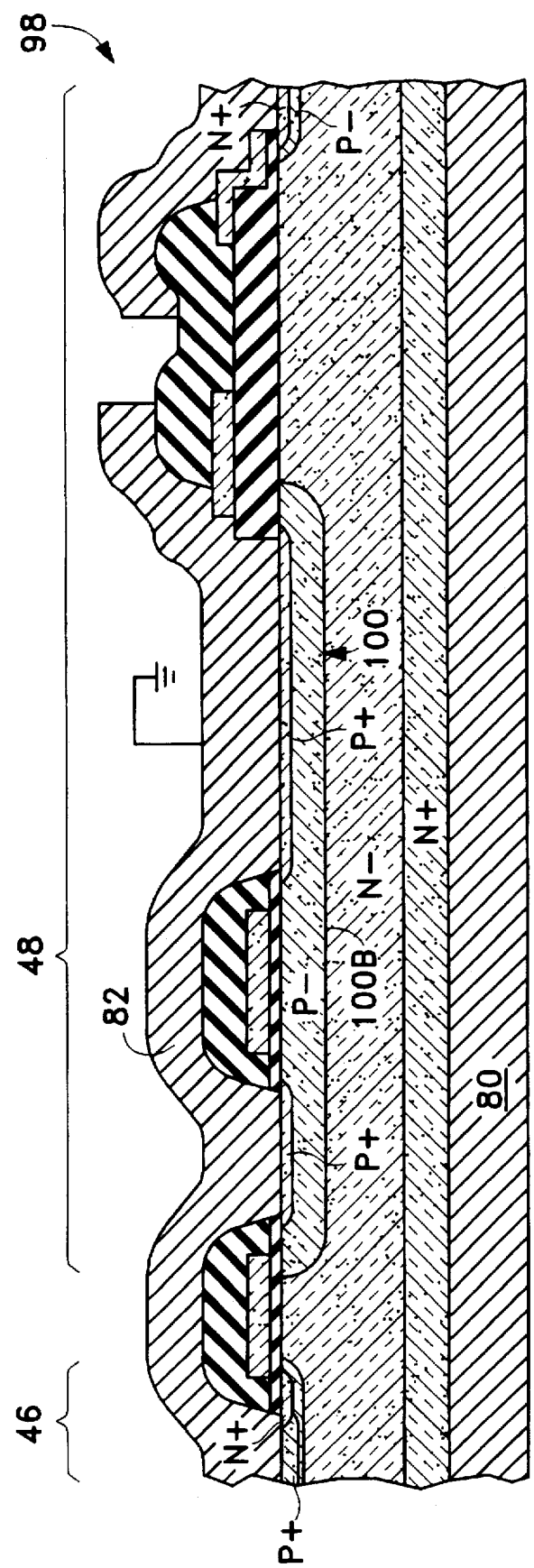
FIG. 8 is a variation of the MOSFET power device shown in FIG. 1.

Finally, other changes are possible within the scope of the present invention. For example, shown in FIG. 8 is another variation of the invention in which the semiconductor structure is denoted by the reference numeral 98 which includes an annular region of 100 having no shallow portion. Instead, there is only a deep portion 100B which performs the dual functions of dissipating breakdown and charge carriers cleaning. Moreover, the invention does not restrict itself to be used in power MOSFETs. The invention can well be used in bipolar devices, tyristors, or rectifier diodes. Furthermore, the invention need not be confined to be used in devices with low breakdown voltages. In addition, the circuits in the active zone 46 need not be repetitive cells, they can very well be other circuits. Examples are microprocessors and operational amplifiers, to name just a few. Moreover, the doping type and concentration need not be limited as described above. For instance, MOSFETs 40, 48 and 90 are fully functional devices if the P-type and N-type materials in the layers are exchanged. While the present invention has been shown and described with reference to preferred embodiments thereof, it will be understood by those skilled in the art that these and other changes in form and detail may be made therein without departing from the scope and spirit of the invention.

What is claimed is:

1. An semiconductor structure having active circuits characterized by an electrical breakdown during one mode of operation, comprising:

a substrate including an epitaxial layer of one conductivity type, said substrate having a major surface;

an annular region of an opposite conductivity type disposed in said epitaxial layer and adjacent said major surface, said annular region being disposed surrounding and spaced from said active circuits, said annular region having a cross-sectional profile including a shallow portion and a deep portion, said deep portion being higher in doping concentration and including a radius of curvature larger than the corresponding doping concentration and radius of curvature, respectively, of any other region, including said shallow portion, disposed in said eptiaxial layer so as to dissipate the electrical breakdown in said annular region in the event of breakdown occurrence during said mode of operation, thereby diverting any breakdown in the active circuits; and conductive means disposed in electrical contact with said annular region.

2. The semiconductor structure as set forth in claim 1 further wherein said annular region further including a plurality of other shallow portions disposed between a plurality of other deep portions.

3. The semiconductor structure as set forth in claim 1 wherein said conductive means includes a plurality of electrical contacts formed of conductive material disposed in contact with said annular region, and wherein during the electrical breakdown of said mode of operation, said substrate generates a multiplicity of charge carriers of different polarity types, said electrical contacts substantially attract charge carriers of one polarity type so as to prevent charge carriers of said one polarity type from reaching the active circuits, thereby diverting any breakdown in the active circuits.

4. The semiconductor structure as set forth in claim 3 further including conductive traces disposed between said electrical contacts and above said annular ring, said conductive traces being dielectrically separated from said electrical contacts and said annular ring.

5. The semiconductor structure as set forth in claim 1 wherein the breakdown being characterized by a breakdown voltage of no greater than 65 volts.

6. The semiconductor structure as set forth in claim 1 further including a channel stopping region disposed surrounding said active circuits and said annular region, said channel stopping region includes a polysilicon layer disposed dielectrically separated from said substrate.

7. The semiconductor structure as set forth in claim 1 wherein said structure being a power MOSFET having a drain, a source and a gate, and wherein said annular region further including a plurality of electrical contacts formed of conductive material disposed in electrical contact with said source, said substrate being in electrical contact with said drain.

8. The semiconductor structure as set forth in claim 7 further including at least one conductive trace disposed between said electrical contacts and above said annular ring, said conductive trace being dielectrically separated from said electrical contacts and said annular ring, said conductive trace being disposed in electrical contact with said gate.

9. The semiconductor structure as set forth in claim 8 wherein said at least one conductive trace comprises polysilicon.

10. The semiconductor structure as set forth in claim 1 wherein said doping concentration of said deep portion ranges from $2\times10^{14}$ cm$^{-2}$ to $2\times10^{15}$ cm$^{-2}$.

11. A semiconductor structure having active circuits characterized by a breakdown during one mode of operation, comprising:

a substrate including an epitaxial layer of one conductivity type, said substrate having a major surface; and an annular region of an opposite conductivity type disposed in said substrate and adjacent said major surface, said annular region being disposed surrounding and spaced from said active circuits, said annular region including a cross-sectional profile having a shallow portion and a deep portion, said deep portion including a contour having a radius of curvature and being doped to a predetermined concentration larger than the corresponding radius of curvature and doping concentration, respectively, of any other region, including said shallow region, in said epitaxial layer so as to dissipate the breakdown in said annular region in the event of breakdown occurrence during said mode of operation; and at least one electrical contact disposed in contact with said annular region, wherein during the electrical breakdown of said mode of operation, said substrate generates a multiplicity of charge carriers of different polarity types, said at least one electrical contact substantially attract charge carriers of said one polarity type, thereby preventing charge carriers of said one polarity type from reaching and causing breakdown in the active circuits.

12. The semiconductor structure as set forth in claim 11 wherein said predetermined doped concentration of said deep portion ranges from $2\times10^{14}$ cm$^{-2}$ to $2\times10^{15}$ cm$^{-2}$, and wherein the doping concentration of said shallow portion is below $1.5\times10^{14}$ cm$^{-2}$.

13. The semiconductor structure as set forth in claim 11 wherein the breakdown being characterized by a breakdown voltage of less than 65 volts.

14. A power MOSFET having active circuits including sources, gates and a common drain and is characterized by an electrical breakdown during one mode of operation, comprising:

a substrate including an epitaxial layer of one conductivity type, said substrate having a major surface, said substrate being in electrical contact with the common drain;

an annular region of an opposite conductivity type disposed in said epitaxial layer and adjacent said major surface, said annular region being disposed surrounding and spaced from said active circuits and having a cross-sectional profile including a shallow portion and a deep portion, said deep portion being higher in doping concentration and including a radius of curvature larger than the corresponding doping concentration and radius of curvature, respectively, of any other region, including said shallow portion, disposed in said epitaxial layer so as to dissipate the electrical breakdown in said annular region in the event of breakdown occurrence during said mode of operation; and conductive means disposed in contact with said annular region, said conductive means being in electrical contact with said sources;

wherein during the electrical breakdown of said mode of operation, said substrate generates a multiplicity of charge carriers of different polarity types, said conductive means substantially attract charge carriers of said one polarity type so as to prevent charge carriers of said one polarity type from reaching the active circuits, thereby diverting any breakdown in the active circuits.

15. The semiconductor structure as set forth in claim 14 wherein the electrical breakdown being characterized by a breakdown voltage of no greater than 65 volts.

16. The semiconductor structure as set forth in claim 15 further including a channel stopping region disposed surrounding said active circuits and said annular region, said channel stopping region includes a polysilicon layer disposed dielectrically separated from said substrate.

17. The semiconductor structure as set forth in claim 16 further including conductive traces disposed between said electrical contacts and above said annular ring, and further being dielectrically separated from said electrical contacts and said annular ring, said conductive traces being disposed in electrical contact with said gates.

18. The semiconductor structure as set forth in claim 17 wherein said predetermined doped concentration of said deep portion ranges from $2\times10^{14}$ cm$^{-2}$ to $2\times10^{15}$ cm$^{-2}$, and wherein the doping concentration of said shallow portion is below $1.5\times10^{14}$ cm$^{-2}$.

* * * * *